(12) United States Patent
Yasuda (10) Patent No.: US 6,921,958 B2
(45) Date of Patent: Jul. 26, 2005

(54) IGBT WITH A SCHOTTKY BARRIER DIODE (75) Inventor: Yukio Yasuda, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 10/689,058

(22) Filed: Oct. 21, 2003

(65) Prior Publication Data

US 2004/0113172 A1 Jun. 17, 2004

(30) Foreign Application Priority Data

Dec. 13, 2002 (JP) ........................ 2002-362133

(51) Int. Cl.[7] ..................... H01L 27/95; H01L 31/0328
(52) U.S. Cl. ........................... 257/477; 257/198
(58) Field of Search ..................... 257/577, 585, 257/572, 197, 473, 477, 198

(56) References Cited

U.S. PATENT DOCUMENTS

| 5,536,958 A | * | 7/1996 | Shen et al. | 257/356 |
| 5,631,494 A | * | 5/1997 | Sakurai et al. | 257/572 |
| 5,654,225 A | * | 8/1997 | Zambrano | 438/138 |
| 5,723,916 A | * | 3/1998 | Disney et al. | 307/131 |
| 6,021,058 A | * | 2/2000 | Yasohara et al. | 363/98 |
| 6,441,463 B2 | | 8/2002 | Yasuda | |

FOREIGN PATENT DOCUMENTS

JP 2002-16254 1/2002

OTHER PUBLICATIONS

K. Yoshida, et al., "A Self–Isolated Intelligent IGBT for Driving Ignition Coils", Proceedings of 1998 International Symposium on Power Semiconductor Devices & ICs, Kyoto, pp. 105–108.

* cited by examiner

Primary Examiner—Howard Weiss
Assistant Examiner—(Vikki) Hoa B. Trinh
(74) Attorney, Agent, or Firm—Oblon, Spivak, MClelland, Maier & Neustadt, P.C.

(57) ABSTRACT

A semiconductor device which IGBT (Z1) and a control circuit (B1) for driving the IGBT (Z1) are formed on the same semiconductor substrate by using a junction isolation technology, includes an input terminal (P1) for inputting a drive signal of the IGBT (Z1), a Schottky barrier diode (D2) having an anode connected to the input terminal (P1) and a cathode connected to an input terminal (B11) of the control circuit (B1), and a p-channel MOSFET (T1) for shorting both ends of the Schottky barrier diode (D2) when the voltage of the drive signal input to the input terminal (P1) is higher than a predetermined voltage, thereby latch-up of the parasitic element is prevented and a transmission loss of the input signal can be reduced.

5 Claims, 6 Drawing Sheets

IGBT WITH A SCHOTTKY BARRIER DIODE

BACKGROUND OF THE INVENTION

1. Field of the Invention

The present invention relates to a semiconductor device having an insulated gate bipolar transistor and a control transistor which are formed on the same semiconductor substrate and, more particularly, to a protecting circuit for preventing latch up caused by a parasitic element generated when an insulated gate bipolar transistor and a control circuit are formed on the same semiconductor substrate by using a junction isolation technology.

2. Related Art

In a general semiconductor device, when a circuit element or a circuit region for a control circuit is formed on a semiconductor substrate on which an insulated gate bipolar transistor (to be referred to as an "IGBT" hereinafter) is formed, a parasitic element is formed. In particular, it is known that, when the circuit element is formed on the IGBT by using a junction isolation technology, a parasitic thyristor is formed on the substrate and the circuit region of the IGBT. There is a problem that when the parasitic thyristor is turned on (latched up), the semiconductor device itself can be broken down.

A countermeasure must be made by providing a protecting element to prevent the parasitic thyristor from being latched up. For example, a method of forming a protecting circuit for protecting latch up by a circuit by combining a resistor and a diode is known (see Reference 1). In a semiconductor device which has been developed before by the applicant of the present application, a means for preventing a thyristor from being latched up is constituted by a Schottky barrier diode (see Reference 2).

[Reference 1] "A Self-isolated intelligent IGBT for driving ignitioncoils", International symposium on Power Semiconductor Drives. & Ics, 1998.

[Reference 2] Japanese Patent Laid-open Publication No. 2002-16254.

A means for preventing a parasitic thyristor from being latched up by using a Schottky barrier diode described in Reference 2 can efficiently achieve an object by using a protecting element which is smaller than that used in a means using a circuit obtained by combining a resistor and a diode. However, in contrast to this, since a Schottky barrier diode is inserted in series with a path extending an input terminal to an actual control circuit, a loss corresponding to a forward voltage drop of the diode is generated in a signal transmitted to the control circuit. In particular, generation of a loss in a signal which can be transmitted to the IGBT when a voltage to be input is low makes it impossible to supply a sufficient voltage to the gate of the IGBT. As a result, a sufficient collector current cannot be obtained.

SUMMARY OF THE INVENTION

It is an object of the present invention to reduce a transmission loss of a voltage signal in such a protecting circuit and realize a reduction in transmission loss by providing a switching circuit including transistors to a protecting circuit without degrading the performance of the protecting circuit.

A semiconductor device according to the present invention is a device on which an insulated gate bipolar transistor and a control circuit for driving the insulated gate bipolar transistor are formed on a same semiconductor substrate. The device includes an input terminal via which a drive signal of the insulated gate bipolar transistor is input, a Schottky barrier diode having an anode connected to the input terminal and a cathode connected to an input terminal of the control circuit, and a p-channel MOSFET that shorts both ends of the Schottky barrier diode when the voltage of the drive signal input to the input terminal is higher than a predetermined voltage.

DESCRIPTION OF PREFERRED EMBODIMENTS

Preferred embodiments of the semiconductor device according to the present invention will be described below with reference to the accompanying drawings.

First Embodiment

Figure 1:
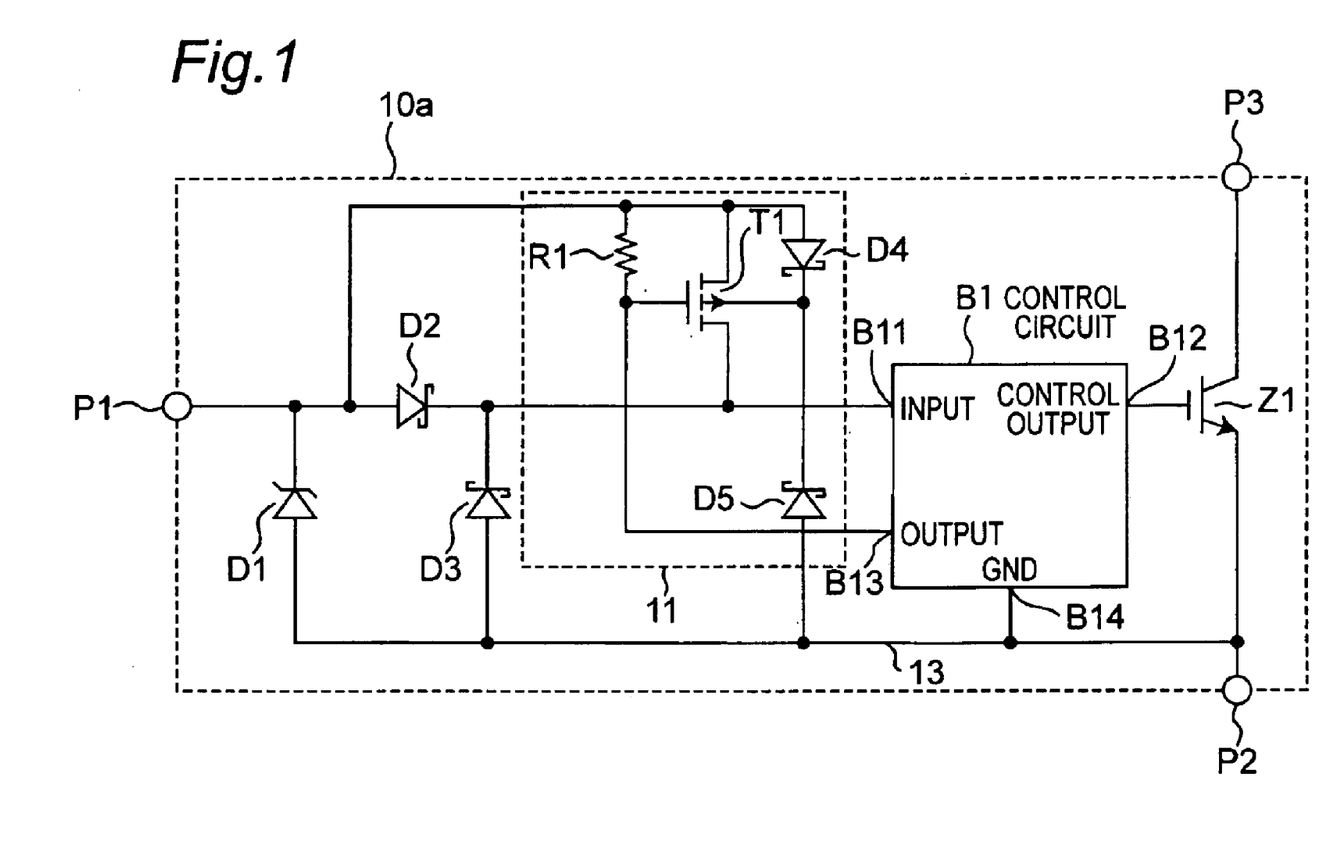
FIG. 1 is a diagram of a semiconductor device according to the first embodiment of the present invention.

FIG. 1 shows a circuit configuration of a semiconductor device according to the first embodiment of the present invention.

As shown in FIG. 1, a semiconductor device 10a according to this embodiment has an IGBT (Z1) and a control circuit B1 for driving the IGBT (Z1). The IGBT (Z1) and the control circuit B1 are formed on the same semiconductor substrate, and the control circuit B1 has a plurality of semiconductor elements. In order to prevent the parasitic thyristor generated with formation of the semiconductor element composing the control circuit B1 from being latched up, the semiconductor device 10a has a protecting circuit including a Zener diode D1 and Schottky barrier diodes D2 and D3. In addition, the semiconductor device 10a has a bypass circuit 11 including a resistor R1, a p-channel MOSFET (T1), and Schottky barrier diodes D4 and D5. The semiconductor device 10a has an input terminal P1, an emitter terminal P2, and a collector terminal P3. The input terminal P1 is applied with an external input signal for driving the IGBT (Z1). The emitter terminal P2 is connected to the reference potential.

The control circuit B1 has an input terminal B11, a control output terminal B12 connected to the gate of the IGBT (Z1), an output terminal B13, and a GND terminal B14 connected to a ground line 13 for giving a reference potential. The control circuit B1 outputs a signal for driving an IGBT (Z1) depending on a signal input to the input terminal B11 through the input terminal P1, from the control output terminal B12. In addition, the control circuit B1 has a function of detecting a voltage input to the input terminal B11 (i.e., a voltage of the input terminal P1) and sinking a current through the output terminal B13 when a predetermined voltage $V_r$ or more is applied to the input terminal B11. For this reason, the control circuit B1 has a circuit for detecting whether the predetermined voltage $V_r$ or more is applied to the input terminal B11 or not.

The source of the p-channel MOSFET (T1) is connected to the input terminal P1 of the semiconductor device 10a, the drain is connected to the input terminal B11 of the control circuit B1, and the gate is connected to the output terminal B13 of the control circuit B1. One end of the resistor R1 is connected to the input terminal P1, and the other end is connected to the gate of the p-channel MOSFET (T1). The resistor R1 operates such that a gate-source voltage of the p-channel MOSFET (T1) is adjusted to zero in a state in which a current is not sunk from the output terminal B13 of the control circuit B1.

In the bypass circuit 11, the cathode of the Schottky barrier diode D4 and the cathode of the Schottky barrier diode D5 are connected to the backgate of the p-channel MOSFET (T1). The anode of the Schottky barrier diode D4 is connected to the input terminal P1, and the anode of the Schottky barrier diode D5 is connected to the ground line 13. With this configuration, the parasitic element of the backgate of the p-channel MOSFET (T1) of the bypass circuit 11 is prevented from being erroneously operated (the details thereof will be described hereafter).

An operation of the semiconductor device 10a will be described below.

When a small voltage is supplied to the input terminal P1 of the semiconductor device 10a, a voltage which is lower than a voltage applied to the input terminal P1 by a voltage drop of the Schottky barrier diode D2 is supplied to the terminal B11 of the control circuit B1. At this time, a voltage across the resistor R1 is lower than the threshold voltage of the p-channel MOSFET (T1), and thus the p-channel MOSFET (T1) is in an OFF state.

As a voltage applied to the input terminal P1 increases, a voltage applied to the input terminal B11 increases. When an input voltage to the input terminal B11 is equal to or more than the predetermined voltage $V_r$ specified by the control circuit B1, a current is sunk from the output terminal B13. When the current is sunk, voltage drop occurs at both the ends of the resistor R1 in the bypass circuit 11. When the voltage across the resistor R1 exceeds the threshold voltage $V_{th}$ of the p-channel MOSFET (T1), the p-channel MOSFET (T1) is turned on to short both ends of the Schottky barrier diode D2 between the input terminal P1 and the input terminal B11.

In this manner, since a voltage drop between the input terminal P1 and the input terminal B11 of the control circuit B1 is decreased by short-cutting both ends of the Schottky barrier diode D2 by the bypath circuit 11, a higher voltage is applied to the input terminal B11 of the control circuit B1. A circuit for detecting the voltage input to the input terminal B11 arranged in the control circuit B1 is a waveform shaping circuit which prevents a signal from being transmitted to the IGBT (Z1) when a voltage to the input terminal B11 is low. For this reason, when the input voltage is equal to or less than the predetermined voltage $V_r$ in the above operation, the input signal is not easily transmitted. On the other hand, when the input voltage is equal to or more than the predetermined voltage $V_r$, a transmission loss of the input signal in a protecting circuit (mainly, the Schottky barrier diode D2) is reduced.

When an input voltage at a high level is changed into a voltage at a low level, the circuit operates vice versa. More specifically, under the state that voltage signal is transmitted from the input terminal P1 to the input terminal B11 with a small loss, when the input voltage is equal to or less than the predetermined voltage $V_r$, the p-channel MOSFET (T1) is turned off, and a transmission loss of the voltage signal transmitted from the input terminal P1 to the input terminal B11 increases. With this operation, a semiconductor device 10a has hysteresis characteristics in response to an input signal.

A forward voltage drop caused by the Schottky barrier diode D2 is represented by $V_f(D2)$ [V], an ON resistance obtained when the p-channel MOSFET (T1) is in an ON state is represented by $R_{on}(t1)$ [Ω], and a current flowing into the input terminal B11 of the control circuit B1 is represented by $I_{B1}$ [A]. At this time, a hysteresis voltage (difference between a voltage at which the p-channel MOSFET (T1) is turned on from off and a voltage at which the p-channel MOSFET (T1) is turned off from on) $V_{hys}$ [V] can be expressed by the following equation:

$$V_{hys} = V_f(D2) - R_{on}(t1) \times I_{B1}.$$

The hysteresis characteristics as mentioned above provides an advantage which can prevent an erroneous operation caused by small noise in a state in which a voltage signal when the MOSFET is turned on/off.

Figure 2:
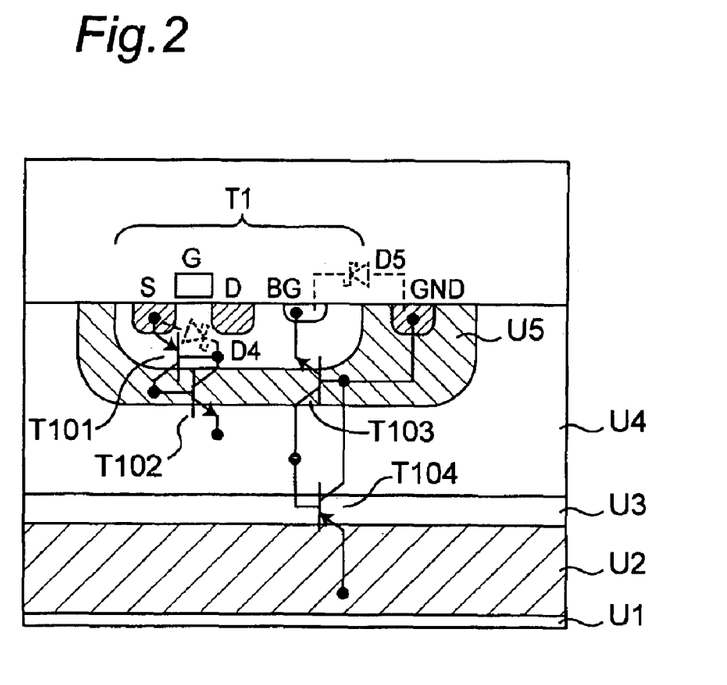
FIG. 2 is a diagram showing a parasitic transistor formed on a p-channel MOSFET in a bypass circuit.

FIG. 2 is a diagram showing a parasitic transistor being parasitic on the p-channel MOSFET (T1) formed on the semiconductor substrate on which the IGBT (Z1) is formed. As shown in FIG. 2, an $n^+$ layer U3, an $n^-$ layer U4, and a p-well U5 are sequentially formed on a p-type semiconductor substrate U2 in this order. A metal layer U1 is formed on the rear surface of the p-type semiconductor substrate U2.

A transistor T101 is a parasitic pnp transistor formed in regions for the source S or the drain D and the backgate BG of the p-channel MOSFET (T1), and the p-well U5. A transistor T102 is an npn transistor formed in the backgate BG, the p-well U5, and the $n^-$ layer U4 of the IGBT (Z1) of the p-channel MOSFET. Connection is performed such that the base and the collector of the transistor T101 serve as the collector and the base of the transistor T102, respectively, and the transistor T101 and the transistor T102 compose a parasitic thyristor. The parasitic thyristor is latched up when the potential of the p-well U5 is higher than that of the $n^-$ layer U4, in a state where a current flows from the source S or the drain D to the backgate BG of the p-channel MOSFET (T1). The IGBT (Z1) is turned on, and the potential of the $n^-$ layer U4 of the IGBT (Z1) in a region having a small collector current approximately becomes zero volt. When the IGBT (Z1) is turned on, the thyristor is latched up.

Similarly, a transistor T103 is a parasitic npn transistor formed in the backgate BG, the p-well U5, and the $n^-$ layer U4 of the p-channel MOSFET (T1). A transistor T104 is a parasitic pnp transistor formed in the substrate U2, the n-layers U3, U4, and the p-well U5 of the IGBT substrate. Connection is performed such that the base and the collector of the transistor T103 serve as the collector and the base of the transistor T104, respectively. A parasitic thyristor occurs in the vertical direction of the substrate. This parasitic thyristor is latched up when the backgate layer and p-well layer of the p-channel MOSFET (T1) are biased in the forward direction.

As shown in FIG. 2, the Schottky barrier diode D4 is connected in parallel between the base and emitter of the transistor T101, and the Schottky barrier diode D5 is connected in parallel between the base and emitter of the transistor T103. Hence, currents flowing in the parasitic transistors T101 and T103 generated by forming the p-channel MOSFET (T1) are bypassed by the Schottky barrier diodes D4 and D5. Therefore, a thyristor operation performed by these parasitic transistors can be effectively prevented.

Second Embodiment

Figure 3:
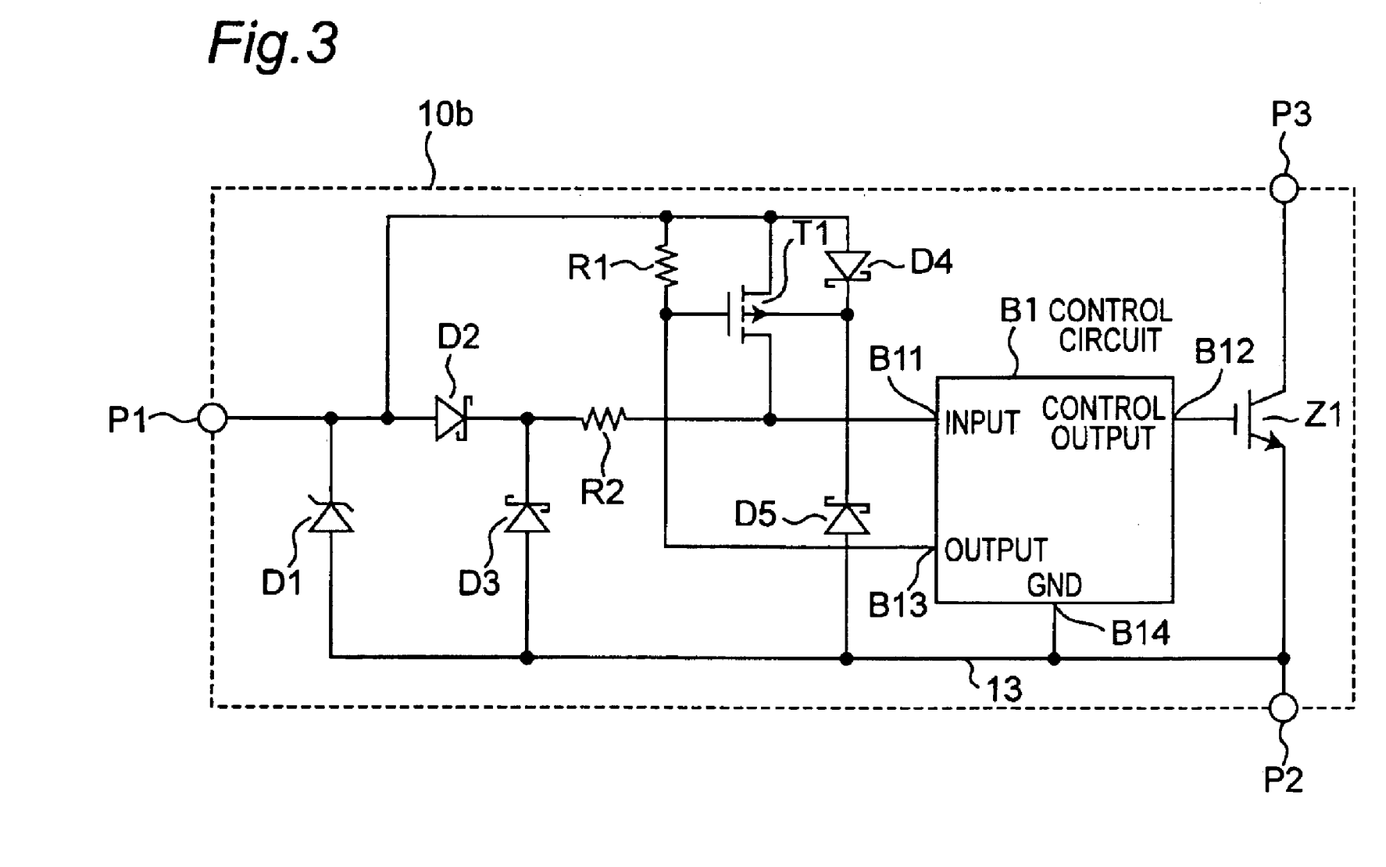
FIG. 3 is a diagram of a semiconductor device according to the second embodiment of the present invention.

FIG. 3 shows the configuration of a semiconductor device according to the second embodiment of the present invention.

In a semiconductor device 10b according to this embodiment, a resistor R2 is serially inserted between the cathode of the Schottky barrier diode D2 and the input terminal B11 of the control circuit B1 in the configuration of the first embodiment. The resistor R2 operates to increase a voltage drop from the voltage of the input terminal P1 to the voltage of the input terminal B11 of the control circuit B1 when the p-channel MOSFET (T1) is in an OFF state.

A forward voltage drop caused by the Schottky barrier diode D2 is represented by $V_f(D2)$ [V], an ON resistance obtained when the p-channel MOSFET (T1) is in an ON state is represented by $R_{on}(t1)$ [Ω], the resistance of the resistor R2 is represented by $R_2$ [Ω], and a current flowing into the input terminal B11 of the control circuit B1 at this time is represented by $I_{B1}$ [A]. At this time, a hysteresis voltage $V_{hys}$ [V] can be expressed by the following equation:

$$V_{hys} = (V_f(D2) + R_2 \times I_{B1}) - R_{on}(t1) \times I_{B1}.$$

As expressed by the above equation, the hysteresis voltage can be made larger than that in the first embodiment by the voltage drop of the resistor R2, and thus more improvement of tolerance of an erroneous operation for noise or the like can be expected.

Third Embodiment

Figure 4:
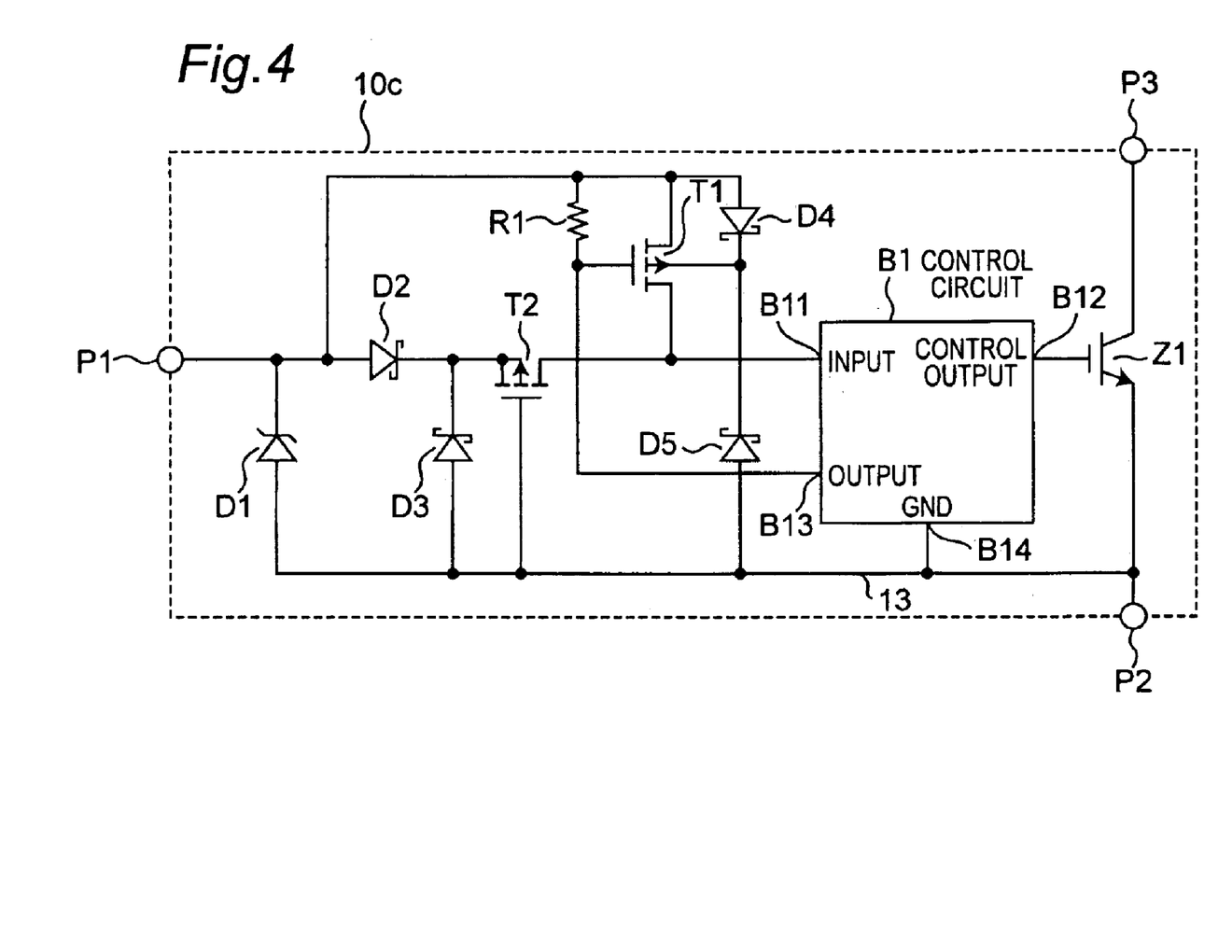
FIG. 4 is a diagram of a semiconductor device according to the third embodiment of the present invention.

FIG. 4 shows the configuration of a semiconductor device according to the third embodiment of the present invention.

A semiconductor device 10c according to this embodiment has a p-channel MOSFET (T2) in place of the resistor R2 in the configuration of the second embodiment. More specifically, the p-channel MOSFET (T2) is connected between the cathode of the Schottky barrier diode D2 and the input terminal B11 of the control circuit B1. The source and backgate of the p-channel MOSFET (T2) are connected to the cathode of the Schottky barrier diode D2, the drain of the Schottky barrier diode D2 is connected to the input terminal B11 of the control circuit B1, and the gate of the p-channel MOSFET (T2) is connected to the ground line 13.

Since the gate of the p-channel MOSFET (T2) is connected to the ground line 13, the p-channel MOSFET (T2) is turned on when a voltage which is equal to or more than the threshold voltage $V_{th}$ of the p-channel MOSFET (T2) is applied to the input terminal P1. A voltage drop between the drain and source of the p-channel MOSFET (T2) is determined based on a voltage at the input terminal P1 and a current flowing in the input terminal B11 of the control circuit B1.

A forward voltage drop caused by the Schottky barrier diode D2 is represented by $V_f(D2)$ [V], an ON resistance obtained when the p-channel MOSFET (T1) is in an ON state is represented by $R_{on}(t1)$ [Ω], an ON resistance obtained when the p-channel MOSFET (T2) is in an ON state is represented by $R_{on}(t2)$ [Ω], and a current flowing into the input terminal B11 of the control circuit B1 at this time is represented by $I_{B1}$ [A]. At this time, a hysteresis voltage $V_{hys}$[V] can be expressed by the following equation:

$$V_{hys} = (V_f(D2) + R_{on}(t2) \times I_{B1}) - R_{on}(t1) \times I_{B1}.$$

As expressed by the above equation, the hysteresis voltage is the total value of the forward voltage drop of the Schottky barrier diode D2 and the voltage drops caused by the ON resistors of the MOSFETs (T1, T2). The channel resistances of the MOSFETs have a positive temperature dependency. The circuit operates such that a negative temperature dependency of the forward voltage drop of the Schottky barrier diode D2 is cancelled by the positive temperature dependency of ON resistance of the MOSFET (T2). The temperature dependency of the hysteresis voltage can be reduced.

Fourth Embodiment

Figure 5:
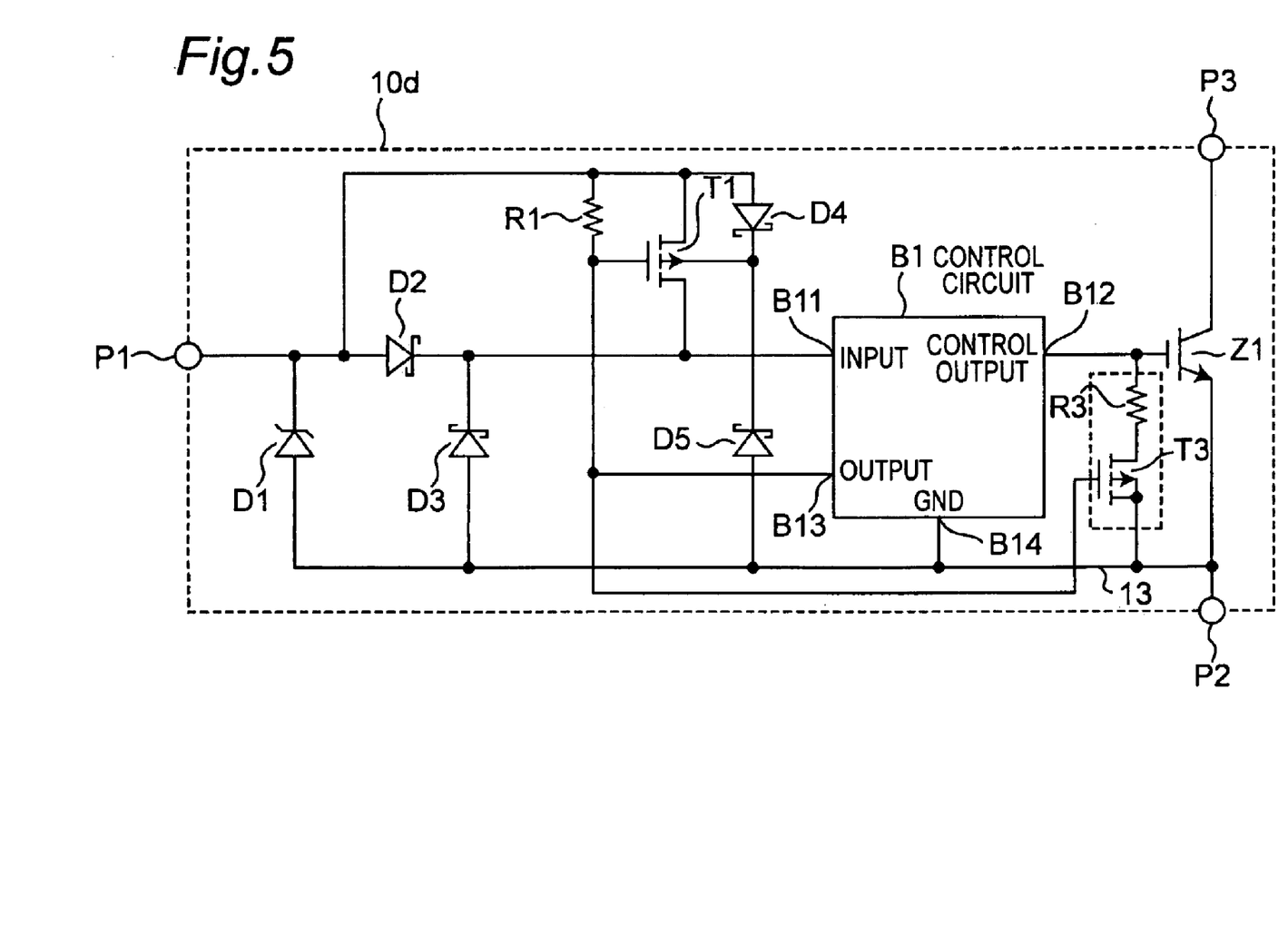
FIG. 5 is a diagram of a semiconductor device according to the fourth embodiment of the present invention.

FIG. 5 shows the configuration of a semiconductor device according to the fourth embodiment of the present invention.

A semiconductor device 10d according to this embodiment includes a series circuit of an n-channel MOSFET (T3) and a resistor R3 in addition to the configuration of the first embodiment.

The gate of the n-channel MOSFET (T3) is connected to the gate of the p-channel MOSFET (T1), the source and backgate of the n-channel MOSFET (T3) are connected to the ground line 13, and the drain of the n-channel MOSFET (T3) is connected to one end of the resistor R3. The other end of the resistor R3 is connected to the gate of the IGBT (Z1).

The same signal as the signal applied to the gate of the p-channel MOSFET (T1) is applied to the gate of the n-channel MOSFET (T3). However, when a voltage which is equal to or lower than the predetermined voltage $V_r$ set by the control circuit B1 is input, a voltage which is almost equal to the voltage of the input terminal P1 is applied to the gate of the n-channel MOSFET (T3). When this voltage is equal to or more than the threshold voltage $V_{th}$ of the n-channel MOSFET (T3), the n-channel MOSFET (T3) is turned on. When the n-channel MOSFET (T3) is in an ON state, the gate of the IGBT (Z1) is grounded through the resistor R3 connected to the drain of the n-channel MOSFET (T3). When the input voltage becomes equal to or more than the predetermined voltage to turn on the p-channel MOSFET (T1), the n-channel MOSFET (T3) is turned off accordingly. Hence, under a situation in which a voltage must be applied to the gate of the IGBT (Z1) with a low loss, affection by connecting the n-channel MOSFET (T3) can be reduced.

The circuit configuration of this embodiment is valid when the IGBT (Z1) shifts from the ON state to the OFF state. In a transient state immediately after the input signal is cut off when charges are accumulated in the gate capacity of the IGBT, the n-channel MOSFET (T3) is turned on to actively discharge the gate charges, so that the shut-off velocity of the IGBT (Z1) increases. By using this means, the shut-off velocity can be increased without increasing a current consumption in the input terminal P1 in a normal operation, and the response can be improved.

Fifth Embodiment

Figure 6:
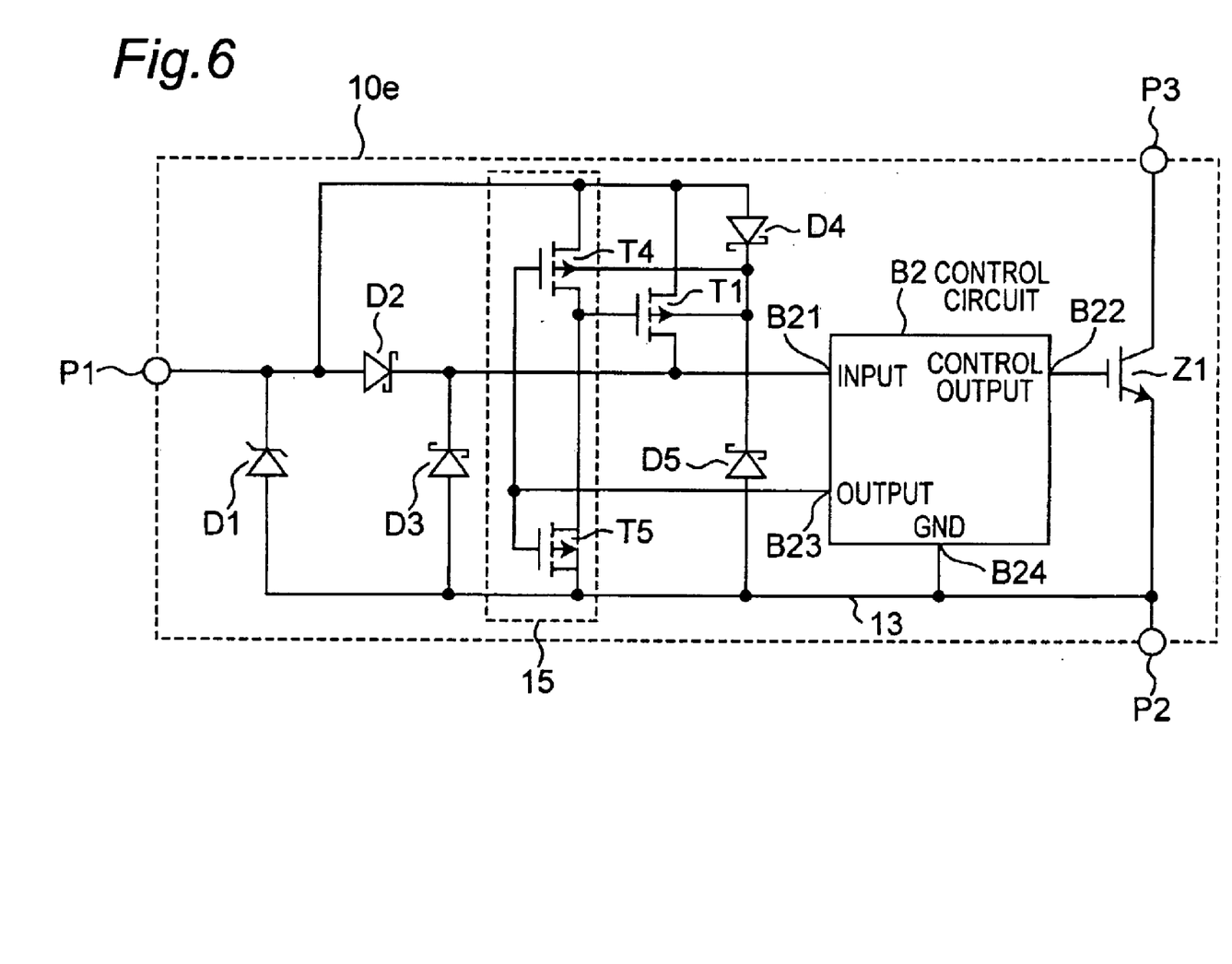
FIG. 6 is a diagram of a semiconductor device according to the fifth embodiment of the present invention.

FIG. 6 shows the configuration of a semiconductor device according to the fifth embodiment of the present invention.

In a semiconductor device 10e according to this embodiment, an inverter circuit 15 having a p-channel MOSFET (T4) and a n-channel MOSFET (T5) is arranged in place of the resistor R1 in the configuration of the first embodiment, and a control circuit B2 is arranged in place of the control circuit B1 in the configuration of the first embodiment.

The output terminal of the inverter circuit 15 is connected to the gate of the p-channel MOSFET (T1). The source of the p-channel MOSFET (T4) is connected to the input terminal P1, the drain of the p-channel MOSFET (T4) is connected to the gate of the p-channel MOSFET (T1), and the backgate of the p-channel MOSFET (T4) is connected to the backgate of the p-channel MOSFET (T1). The source and backgate of the n-channel MOSFET (T5) are connected to the ground line 13, and the drain of the n-channel MOSFET (T5) is connected to the gate of the p-channel MOSFET (T1). The gate of the p-channel MOSFET (T4) and the gate of the n-channel MOSFET (T5) are connected to each other and connected to an output terminal B23 of the control circuit B2.

In FIG. 6, The backgates of the p-channel MOSFET (T4) and the p-channel MOSFET (T1) are connected. However, the same circuit as that including the Schottky barrier diodes D4 and D5 may be provided for only the p-channel MOSFET (T4) so that both backgates are not connected, the same effect as described above can be achieved.

The control circuit B2 has an input terminal B21, a control output terminal B22 connected to the gate of IGBT (Z1), an output terminal B23, and a GND terminal B24 connected to the ground line 13 for giving a reference potential. The control circuit B2 causes the control output terminal B22 to output a signal for driving an IGBT (Z1) depending on a signal input to the input terminal B21 through the input terminal P1. I addition, the control circuit B2 detects a voltage input to the input terminal B21, outputs a voltage, which is high enough to turn on the n-channel MOSFET (T5) through the output terminal B23, when the predetermined voltage $V_r$ or more is applied to the input terminal B21. Otherwise, the control circuit B2 outputs a voltage which is low enough to turn on the p-channel MOSFET (T4). Any signal which is output from a circuit except for the control circuit B2 may be input to the input terminal of the inverter circuit 15, as long as the signal is a comparison result signal obtained by comparing a detected voltage input to the input terminal B21 (or the input terminal P1) of the control circuit B2 with the predetermined voltage $V_r$.

According to the circuit shown in FIG. 6, the p-channel MOSFET (T4) turns off when the n-channel MOSFET (T5) is in an ON state, the p-channel MOSFET (T4) turns on when the n-channel MOSFET (T5) is in an OFF state. Hence the p-channel MOSFET (T4) and the n-channel MOSFET (T5) complementarily operate, and a current which is stationarily consumed can be reduced as in a conventional CMOS logical circuit. This advantage further reduces the current consumption in the circuit than the first embodiment.

According to the present invention, in a semiconductor device on which an insulated gate bipolar transistor and a control circuit are formed on the same semiconductor substrate by using a junction isolation technology, a transmission loss of an input signal can be reduced while preventing latch up caused by a parasitic element generated by forming the control circuit.

What is claimed is:

1. A semiconductor device on which an insulated gate bipolar transistor and a control circuit for driving the insulated gate bipolar transistor are formed on a same semiconductor substrate, comprising:
    an input terminal via which a drive signal of the insulated gate bipolar transistor is input;
    a Schottky barrier diode having an anode connected to the input terminal and a cathode connected to an input terminal of the control circuit; and
    a first p-channel MOSFET that shorts both ends of the Schottky barrier diode when the voltage of the drive signal input to the input terminal is higher than a predetermined voltage.

2. The semiconductor device according to claim 1, further comprising a resistor which is interposed between the cathode of the Schottky barrier diode and the input terminal of the control circuit.

3. The semiconductor device according to claim 1, further comprising a second p-channel MOSFET which is serially connected between the cathode of the Schottky barrier diode and the input terminal of the control circuit.

4. The semiconductor device according to claim 1, wherein a series circuit of a resistor and a second p-channel MOSFET is connected between the gate and the emitter of the insulated gate bipolar transistor.

5. The semiconductor device according to claim 1, further comprising a CMOS inverter circuit having an output terminal connected to the gate of the first p-channel MOSFET, wherein a signal depending on a signal level of the drive signal input via the input terminal is input to the input terminal of the CMOS inverter circuit.

* * * * *

UNITED STATES PATENT AND TRADEMARK OFFICE
CERTIFICATE OF CORRECTION

PATENT NO. : 6,921,958 B2  Page 1 of 1
APPLICATION NO. : 10/689058
DATED : July 26, 2005
INVENTOR(S) : Yasuda

It is certified that error appears in the above-identified patent and that said Letters Patent is hereby corrected as shown below:

On the title page, Item (54) and column 1, the Title information is incorrect. Item (54) and column1 should read as follows:

--[54] SEMICONDUCTOR DEVICE --

Signed and Sealed this

Seventh Day of November, 2006

JON W. DUDAS
*Director of the United States Patent and Trademark Office*